(12) United States Patent
Endo et al.

(10) Patent No.: US 9,385,152 B2
(45) Date of Patent: Jul. 5, 2016

(54) SOLID-STATE IMAGE PICKUP DEVICE AND IMAGE PICKUP SYSTEM

(71) Applicant: CANON KABUSHIKI KAISHA, Tokyo (JP)

(72) Inventors: Nobuyuki Endo, Fujisawa (JP); Tetsuya Itano, Sagamihara (JP); Kazuo Yamazaki, Yokohama (JP); Kyouhei Watanabe, Yokohama (JP); Takeshi Ichikawa, Hachioji (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/543,237

(22) Filed: Nov. 17, 2014

(65) Prior Publication Data

US 2015/0138388 A1    May 21, 2015

Related U.S. Application Data

(63) Continuation of application No. 13/517,357, filed as application No. PCT/JP2010/007414 on Dec. 22, 2010, now Pat. No. 8,912,578.

(30) Foreign Application Priority Data

Dec. 26, 2009  (JP) .................................. 2009-296522

(51) Int. Cl.
*H01L 27/148*  (2006.01)
*H01L 27/146*  (2006.01)

(52) U.S. Cl.
CPC ...... *H01L 27/14636* (2013.01); *H01L 27/1465* (2013.01); *H01L 27/14632* (2013.01); *H01L 27/14643* (2013.01)

(58) Field of Classification Search
USPC .......................................... 257/226, 225, 222
IPC .................................................. H01L 27/14636
See application file for complete search history.

(56) References Cited

U.S. PATENT DOCUMENTS

| 6,309,964 | B1 * | 10/2001 | Tsai et al. ...................... 438/648 |
| 6,537,905 | B1 * | 3/2003 | Chen et al. .................... 438/629 |
| 6,927,432 | B2 * | 8/2005 | Holm et al. .................... 257/290 |
| 7,495,206 | B2 * | 2/2009 | Park ........................... 250/214.1 |
| 7,851,879 | B2 * | 12/2010 | Inoue ............................ 257/435 |
| 7,956,392 | B2 * | 6/2011 | Uya .............................. 257/292 |
| 7,956,394 | B2 * | 6/2011 | Lee .............................. 257/294 |
| 7,965,329 | B2 * | 6/2011 | McCarten et al. ............. 348/308 |
| 8,044,478 | B2 * | 10/2011 | Hwang ........................ 257/444 |
| 8,049,256 | B2 * | 11/2011 | Guidash ....................... 257/292 |
| 8,300,127 | B2 * | 10/2012 | Akiyama ...................... 348/294 |
| 2009/0224345 | A1 * | 9/2009 | Lee et al. ...................... 257/432 |
| 2010/0163932 | A1 * | 7/2010 | Jun .............................. 257/225 |

* cited by examiner

*Primary Examiner* — Eugene Lee
(74) *Attorney, Agent, or Firm* — Canon USA, Inc. IP Division

(57) ABSTRACT

The present invention relates to a solid-state image pickup device. The device includes a first substrate including a photoelectric conversion element and a transfer gate electrode configured to transfer charge from the photoelectric conversion element, a second substrate having a peripheral circuit portion including a circuit configured to read a signal based charge generated in the photoelectric conversion element, the first and second substrates being laminated. The device further includes a multilayer interconnect structure, disposed on the first substrate, including an aluminum interconnect and a multilayer interconnect structure, disposed on the second substrate, including a copper interconnect.

19 Claims, 14 Drawing Sheets

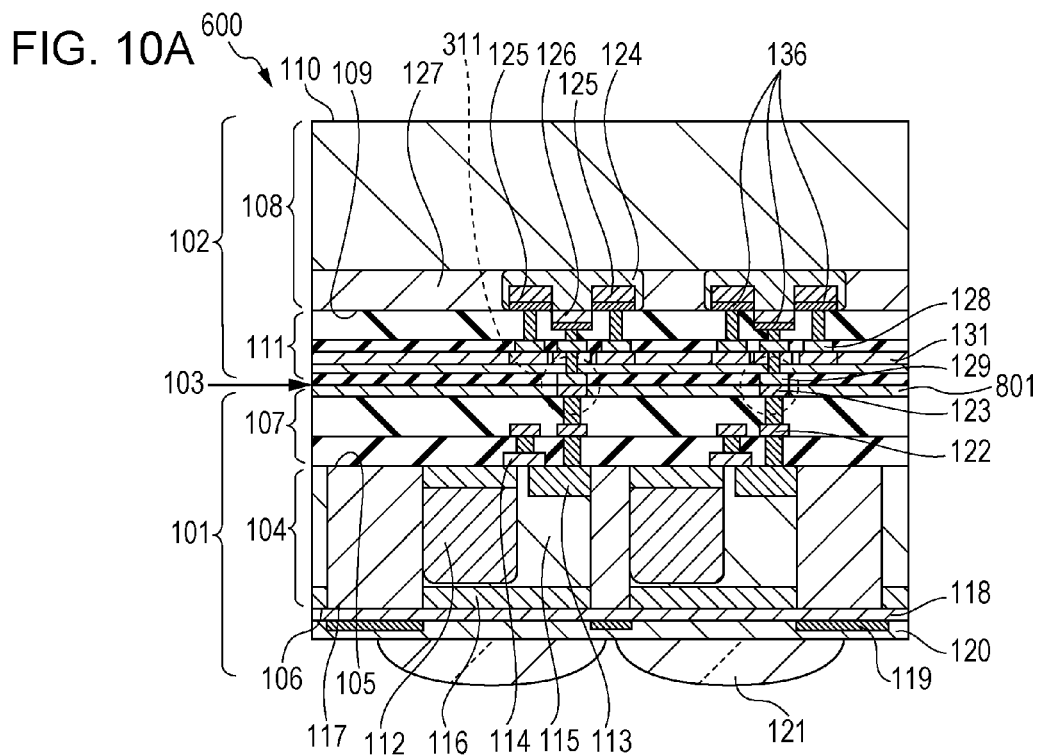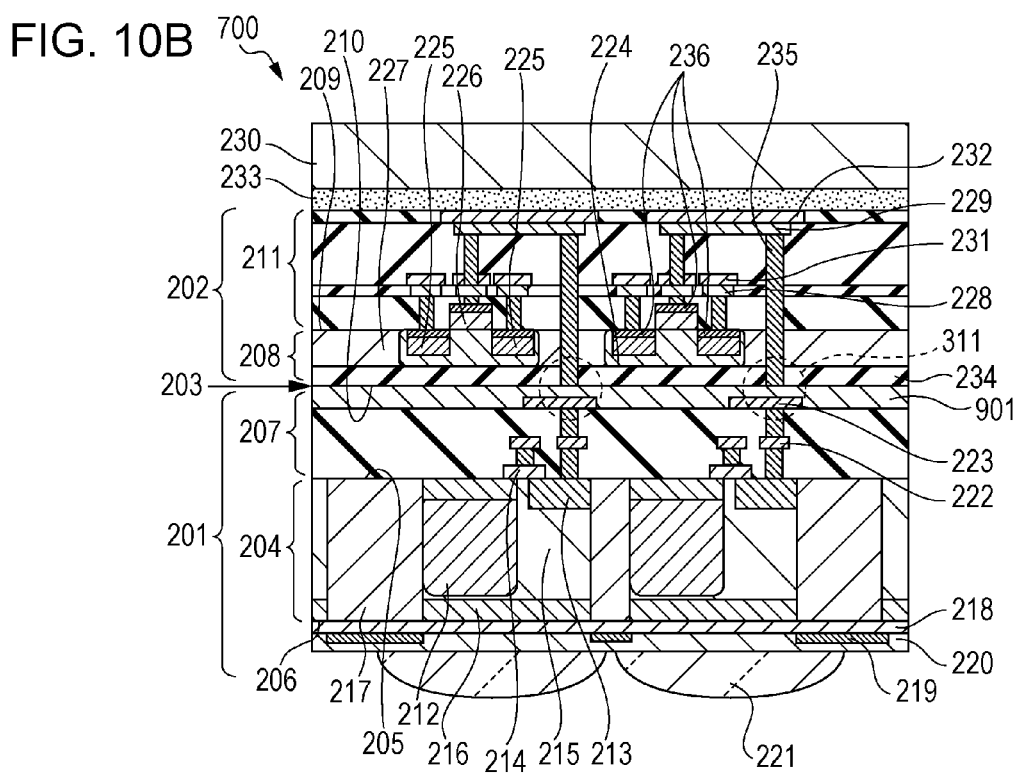

SOLID-STATE IMAGE PICKUP DEVICE AND IMAGE PICKUP SYSTEM

CROSS-REFERENCE TO RELATED APPLICATION

This application is a Continuation of U.S. application Ser. No. 13/517,357, filed Jun. 20, 2012, which is a National Phase application of International Application PCT/JP2010/007414, filed Dec. 22, 2010, which claims the benefit of Japanese Patent Application No. 2009-296522, filed Dec. 26, 2009, which is hereby incorporated by reference herein in its entirety.

TECHNICAL FIELD

The present invention relates to a back side illumination solid-state image pickup device.

BACKGROUND ART

In recent years, trends toward finer pattern designing of solid-state image pickup devices have been advancing. With the trends, a copper interconnect which allows finer interconnection is beginning to be applied to solid-state image pickup devices.

PTL 1 discloses a solid-state image pickup device including copper interconnects and having a configuration in which antidiffusion films for the copper interconnects are not arranged above each photoelectric conversion element.

PTL 2 discloses a back side illumination solid-state image pickup device including a substrate that includes a pixel portion provided with photoelectric conversion elements and signal reading circuits and a substrate that includes peripheral circuits driving the circuits in the pixel portion and processing read signals, the substrates being joined to each other.

In the configuration disclosed in PTL 1, copper may diffuse into the photoelectric conversion element because the diffusion coefficient of copper is extremely high. Assuming that the surface of each copper interconnect is protected using the antidiffusion film, for example, after a layer containing copper is formed on the same substrate, copper may diffuse from the end surfaces or the rear surface of the substrate. If an impurity, such as copper, is incorporated into a semiconductor region which constitutes the photoelectric conversion element, the copper incorporation causes dark current or leakage current. Disadvantageously, for example, a white defect occurs in image data.

CITATION LIST

Patent Literature

[PTL 1]
Japanese Patent Laid-Open No. 2005-311015
[PTL 2]
Japanese Patent Laid-Open No. 2009-170448

SUMMARY OF INVENTION

The present invention provides a solid-state image pickup device capable of preventing the occurrence of dark current or leakage current in a photoelectric conversion element while including a copper interconnect.

The present invention provides a solid-state image pickup device including a first substrate including a photoelectric conversion element and a transfer gate electrode configured to transfer charge from the photoelectric conversion element, a second substrate having a peripheral circuit portion including a circuit configured to read a signal based on charge generated in the photoelectric conversion element, the first and second substrates being laminated. The device further includes a multilayer interconnect structure, disposed on the first substrate, including an aluminum interconnect and a multilayer interconnect structure, disposed on the second substrate, including a copper interconnect.

BRIEF DESCRIPTION OF DRAWINGS

FIG. 10A is a cross-sectional view of a solid-state image pickup device according to a fifth embodiment of the present invention.

FIG. 10B is a cross-sectional view of the solid-state image pickup device according to the fifth embodiment.

DESCRIPTION OF EMBODIMENTS

Figure 1:
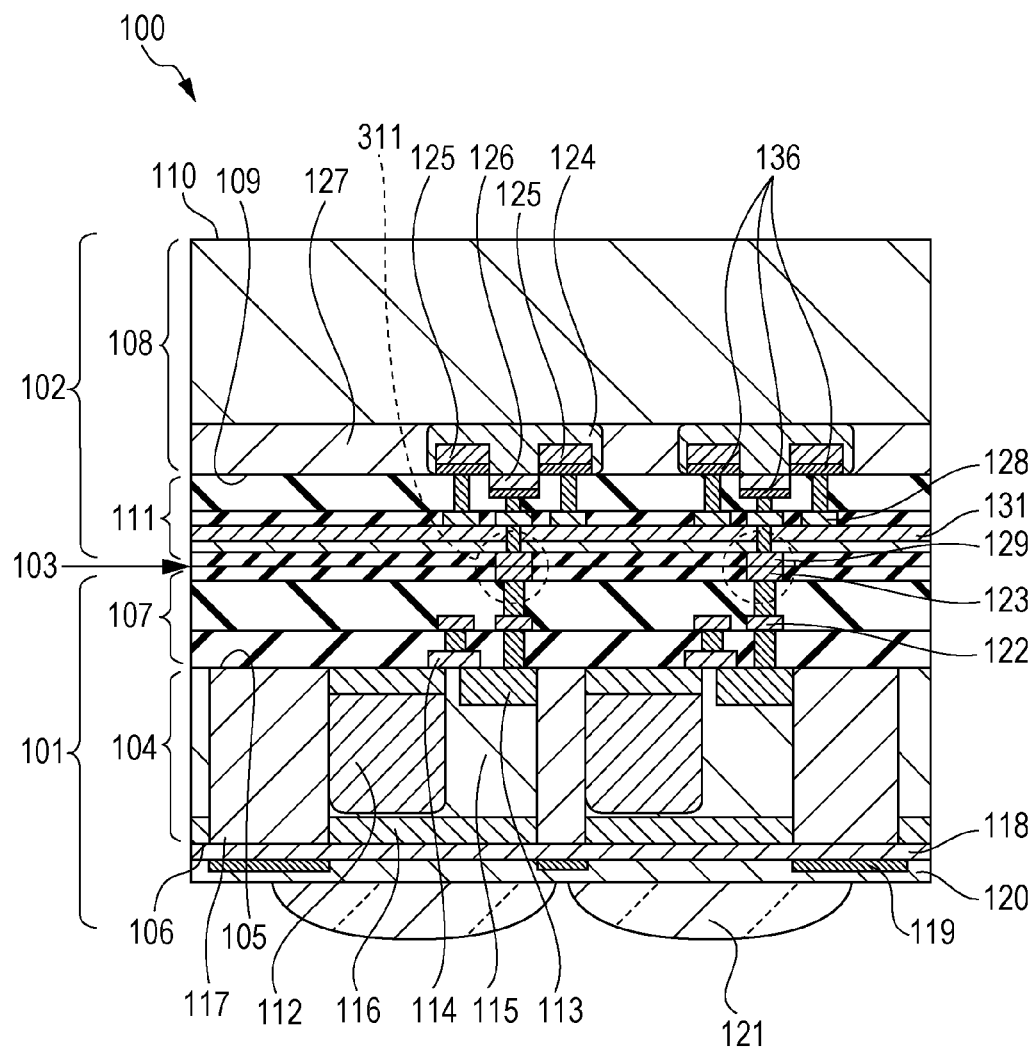
FIG. 1 is a cross-sectional view of a solid-state image pickup device according to a first embodiment of the present invention.

A solid-state image pickup device according to an embodiment of the present invention includes a first substrate including a photoelectric conversion element and a transfer gate electrode and a second substrate including a control circuit, the first and second substrates being laminated. Interconnection for the first substrate is made by an aluminum interconnect. Interconnection for the control circuit of the second substrate is made by a copper interconnect. With such a configuration, the occurrence of dark current or leakage current in the photoelectric conversion element can be prevented.

The present invention will be described in detail below with reference to the drawings.

[First Embodiment]

A first embodiment of the present invention will be described with reference to FIGS. 1 and 11.

Exemplary circuitry of a solid-state image pickup device according to the first embodiment will be described first with reference to FIG. 11. Referring to FIG. 11, the solid-state image pickup device, indicated at 300, includes a pixel portion 301 where a plurality of photoelectric conversion elements are arranged, and a peripheral circuit portion 302 provided with driving control circuits for reading signals from the pixel portion 301 and a signal processing circuit processing the read signals.

The pixel portion 301 is provided with photoelectric conversion elements 303, transfer transistors 304, amplifying transistors 306, and reset transistors 307. A component including at least one photoelectric conversion element 303 functions as a pixel. In the present embodiment, each pixel includes the photoelectric conversion element 303, the transfer transistor 304, the amplifying transistor 306, and the reset transistor 307. The transfer transistor 304 has a source region connected to the photoelectric conversion element 303 and a drain region connected to the gate electrode of the amplifying transistor 306. A node 305 is the same node as the gate electrode of the amplifying transistor 306. The reset transistor 307 is connected to the node 305. The potential at the node 305 is set to an arbitrary value (for example, a reset potential) by the reset transistor 307. In this case, the amplifying transistor 306 serves as part of a source follower circuit and outputs a signal based on the potential at the node 305 to a signal line RL.

The peripheral circuit portion 302 includes a vertical scanning circuit VSR for supplying control signals to the gate electrodes of the transistors in the pixel portion 301. The peripheral circuit portion 302 further includes a reading circuit RC for holding signals output from the pixel portion 301 and performing signal processing, such as amplification, addition, and analog-to-digital (A/D) conversion. In addition, the peripheral circuit portion 302 includes a horizontal scanning circuit HSR, serving as a control circuit for controlling the timing of sequential signal output of the reading circuit RC.

The solid-state image pickup device 300 according to the first embodiment includes a laminate of two chips. The two chips include a first chip 308 and a second chip 309. In the first chip 308, the photoelectric conversion elements 303 and the transfer transistors 304 of the pixel portion 301 are arranged. In the second chip 309, the amplifying transistors 306 and the reset transistors 307 of the pixel portion 301 and the peripheral circuit portion 302 are arranged. In this configuration, a control signal is supplied from the peripheral circuit portion 302 in the second chip 309 to the gate electrode of each transfer transistor 304 in the first chip 308 through a connection portion 310. A signal generated in each photoelectric conversion element 303 in the first chip 308 is read at the node 305 through a connection portion 311 connected to the drain region of the transfer transistor 304. As described above, the reset transistors 307 and the amplifying transistors 306 are arranged in the chip different from the chip in which the photoelectric conversion elements 303 are arranged, thus increasing the area of each photoelectric conversion element 303. This leads to increased sensitivity. If the photoelectric conversion elements 303 have the same area, many photoelectric conversion elements can be arranged, thus increasing the number of pixels.

The solid-state image pickup device according to the present embodiment will be described with reference to FIG. 1. FIG. 1 is a cross-sectional view of a solid-state image pickup device 100 corresponding to the solid-state image pickup device 300 in FIG. 11. FIG. 1 illustrates the cross sections of two pixels each including the photoelectric conversion element 303, the transfer transistor 304, and the amplifying transistor 306 in FIG. 11. The illustration of the other elements is omitted.

FIG. 1 illustrates a first chip 101, a second chip 102, and the junction 103 between the first chip and the second chip. The first chip 101 corresponds to the first chip 308 in FIG. 11 and the second chip 102 corresponds to the second chip 309 in FIG. 11.

The first chip 101 includes a first substrate 104. In the first substrate 104, the surface on which the transistors are arranged is a principal surface 105 and the surface opposite the principal surface 105 is a rear surface 106. In the first substrate 104, parts constituting the photoelectric conversion elements 303 and the transfer transistors 304 in FIG. 11 are arranged. The first chip 101 includes a multilayer interconnect structure 107 on the principal surface 105 of the first substrate 104. The multilayer interconnect structure 107 includes a first interconnect layer 122 and a second interconnect layer 123, each of which includes an interconnect (aluminum interconnect) mainly made of aluminum. In this case, the connection between the interconnect, serving as the first interconnect layer 122, and the interconnect, serving as the second interconnect layer 123, and the connection between the gate electrodes and the interconnect, serving as the first interconnect layer 122 are made using plugs made of, for example, tungsten.

The second chip 102 includes a second substrate 108. In the second substrate 108, the surface on which the transistors are arranged is a principal surface 109 and the surface opposite the principal surface 109 is a rear surface 110. The principal surface 109 of the second substrate 108 is covered with a multilayer interconnect structure 111 including a first interconnect layer 128 and a second interconnect layer 129. The first interconnect layer 128 serves as an interconnect mainly made of copper. The second interconnect layer 129 serves as an aluminum interconnect. The first interconnect layer 128 has a single-damascene structure and is provided thereon with an antidiffusion film 131 for copper. The antidiffusion film 131 covers the first interconnect layer 128 and an insulating layer whose upper surface is flush with that of the first interconnect layer 128. This antidiffusion film 131 is made of, for example, silicon nitride or silicon carbide. The connection between, for example, the gate electrodes and the interconnect, serving as the first interconnect layer 128, and the connection between the first interconnect layer 128 and the second interconnect layer 129 are made through plugs made of, for example, tungsten. In the second substrate 108, parts constituting the amplifying transistors 306 in FIG. 11 are arranged.

In the solid-state image pickup device 100 according to the present embodiment, the first chip 101 and the second chip 102 are laminated such that the principal surface 105 and the principal surface 109 of the substrates face each other. Referring to FIG. 1, only the connection between the gate electrode 126 of each amplifying transistor in the second chip 102 and a floating diffusion region (hereinafter, "FD region") 113 in the first chip 101 is illustrated as the connection portion 311 between the first chip 101 and the second chip 102. Specifically, each FD region 113 in the first chip 101 is connected to the gate electrode 126 of the amplifying transistor through the multilayer interconnect structure 107, the connection portion 311, and the multilayer interconnect structure 111. The connection portions 310, illustrated in FIG. 11, for supplying control signals to the gate electrodes, indicated at 114, of the transfer transistors are not illustrated in FIG. 1. The solid-state image pickup device 100 according to the present embodiment is of the back side illumination type in which light is incident on the rear surface 106 of the first substrate 104.

The chips will be described in details. In the first substrate 104 of the first chip 101, wells 115, n-type charge storage regions 112 constituting the photoelectric conversion elements, and the gate electrodes 114 of the transfer transistors are arranged. In addition, the drain regions, indicated at 113, of the transfer transistors, element isolation regions 117, and p-type semiconductor regions 116 are arranged in the first substrate 104. Each well 115 is a semiconductor region in which the transistor or the photoelectric conversion element is disposed. In this case, the well 115 may be of the n type or the p type. Each p-type semiconductor region 116 can prevent dark current that occurs on the interface between silicon and a silicon oxide film on the rear surface 106 of the first substrate 104 and can also function as part of the photoelectric conversion element. Each charge storage region 112 stores charge (electrons) generated in the photoelectric conversion element. In FIG. 1, the charge storage region 112 includes a p-type protective layer adjacent to the gate electrode of the transfer transistor (hereinafter, also referred to as "transfer gate electrode"). Each element isolation region 117 is a p-type semiconductor region and may have an element isolation structure, formed by LOCOS isolation or STI isolation, including an insulating layer (not illustrated). The drain region 113 of the transfer transistor constitutes the node 305 in FIG. 11 and is called the "FD region". The first chip 101 includes, adjacent to the rear surface 106 of the first substrate 104, an antireflection film 118, a light-shielding film 119, a color filter layer 120 including a planarizing layer or the like, and microlenses 121.

Figure 11:
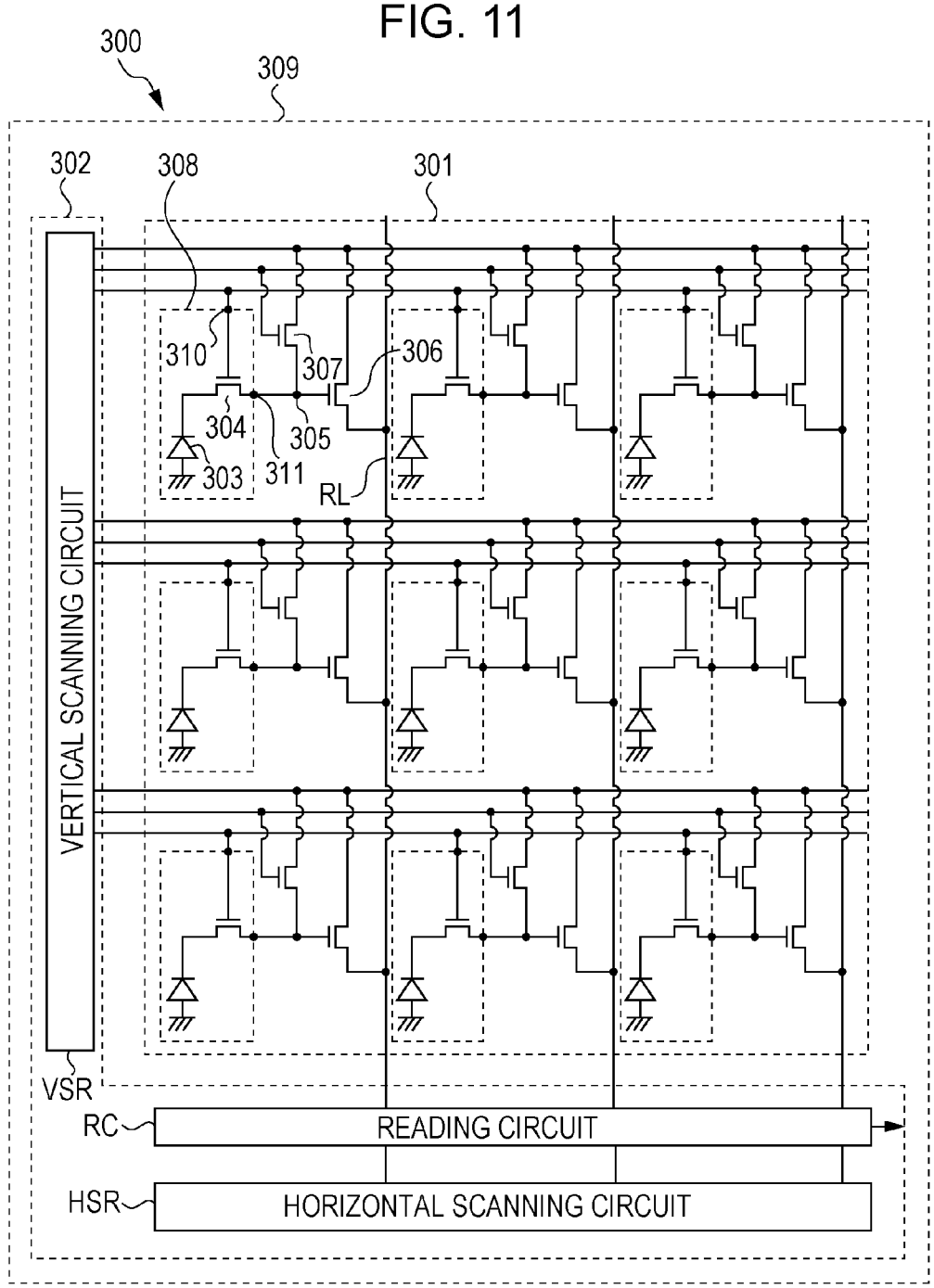
FIG. 11 illustrates exemplary circuitry of a solid-state image pickup device according to an embodiment of the present invention.

In the second substrate 108 of the second chip 102, wells 124, source and drain regions 125 constituting the amplifying transistors 306 in FIG. 11, the gate electrodes 126 of the amplifying transistors 306, and element isolation regions 127 are arranged. In each of the gate electrodes 126 and the source and drain regions 125 of the transistors, a high-melting metal compound film 136 is disposed. Each well 124 is a p-type semiconductor region. The high-melting metal compound film is a compound of a high-melting metal, such as cobalt or titanium, and silicon contained in the semiconductor substrate. Only the second chip 102 of the solid-state image pickup device 100 according to the present embodiment includes the copper interconnect in the multilayer interconnect structure. In addition, a multilayer interconnect structure (not illustrated) including a copper interconnect is disposed on the area corresponding to the peripheral circuit portion 302 in FIG. 11.

The multilayer interconnect structure for the transistors as the control circuits arranged in the second substrate includes the copper interconnect, thus allowing the finer distance between interconnect segments. In addition, since only the second chip 102 has the multilayer interconnect structure including such a copper interconnect, the incorporation of copper into the photoelectric conversion elements can be reduced. Thus, noise caused by the copper incorporation can be reduced.

In addition, since the second chip includes the antidiffusion film 131, copper contained in the copper interconnect included in the second chip can be more effectively prevented from being incorporated into the photoelectric conversion elements and the semiconductor regions, serving as the FD regions, in the first chip.

In the present embodiment, the reason why the second interconnect layer 129 in the second chip includes the aluminum interconnect is that a conductor constituting the interconnect as the second interconnect layer 129 has to be exposed in order to constitute the connection portions. If the second interconnect layer 129 includes a copper interconnect, copper may diffuse from the exposed conductor in the second interconnect layer 129. Therefore, the second interconnect layer 129 may include an aluminum interconnect.

The antidiffusion film 131 for copper can also function as an antidiffusion film for high-melting metal. Accordingly, the incorporation of high-melting metal into the semiconductor regions constituting the photoelectric conversion elements can be reduced. Thus, noise caused by the incorporation of high-melting metal can be reduced.

According to a modification of the present embodiment, the amplifying transistors may be arranged in the first substrate. The photoelectric conversion elements and at least the FD regions may be arranged in the first substrate 104 as in the present embodiment. The reason is that it is possible to reduce the diffusion of copper into the photoelectric conversion elements holding signal charge generated therein and the semiconductor regions constituting the FD regions.

[Second Embodiment]

A solid-state image pickup device according to a second embodiment will be described with reference to FIG. 2. The solid-state image pickup device according to the present embodiment is the same in the circuitry, as illustrated in FIG. 11, as the solid-state image pickup device according to the first embodiment but differs therefrom in the laminated structure of chips. Explanation of the circuitry is omitted. A configuration illustrated in FIG. 2 will be described.

Figure 2:
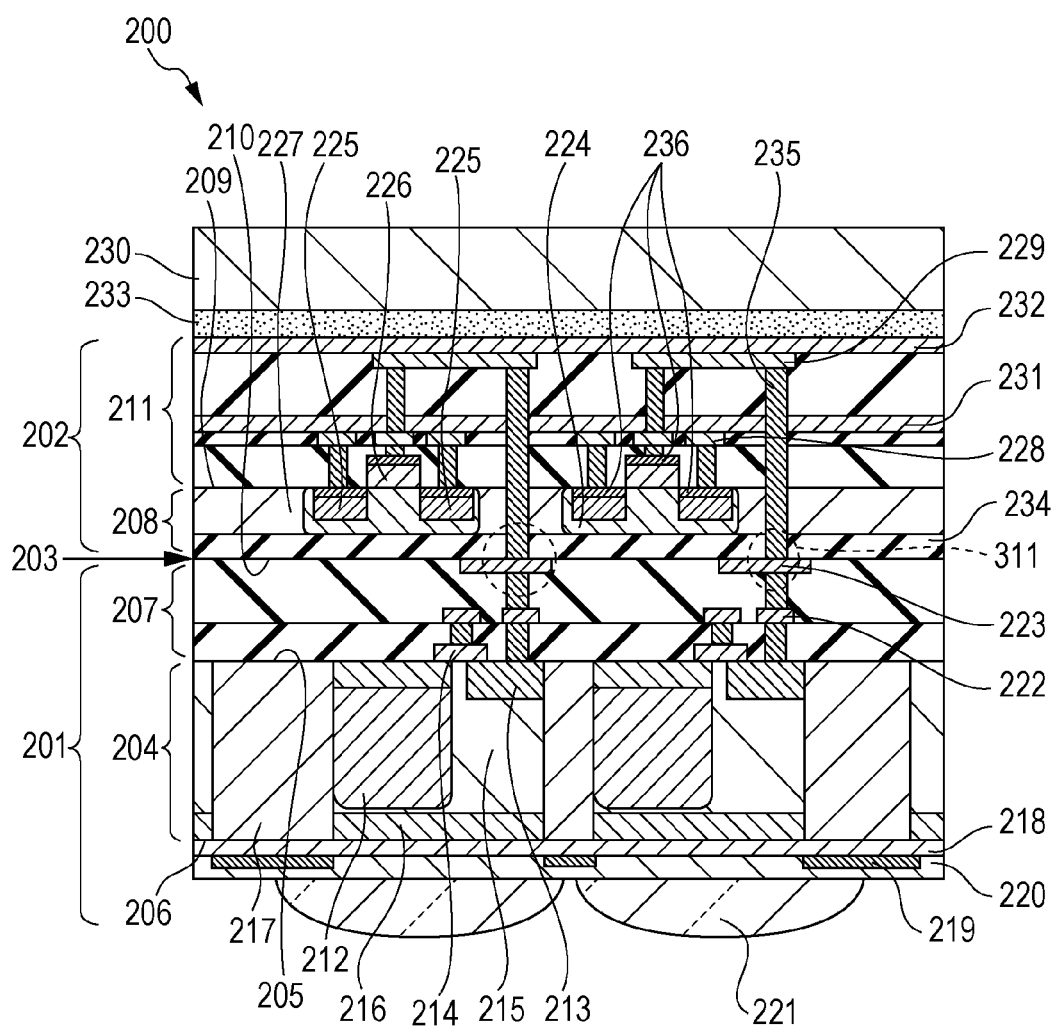
FIG. 2 is a cross-sectional view of a solid-state image pickup device according to a second embodiment of the present invention.

FIG. 2 is a cross-sectional view of the solid-state image pickup device, indicated at 200, corresponding to the circuitry in FIG. 11. FIG. 2 illustrates the cross sections of two pixels each including the photoelectric conversion element 303, the transfer transistor 304, and the amplifying transistor 306 in FIG. 11. The illustration of the other elements is omitted.

FIG. 2 illustrates a first chip 201, a second chip 202, and the junction 203 between the first chip and the second chip. The first chip 201 corresponds to the first chip 308 in FIG. 11 and the second chip 202 corresponds to the second chip 309 in FIG. 11.

The first chip 201 includes a first substrate 204. In the first substrate 204, the surface on which the transistors are arranged is a principal surface 205 and the surface opposite the principal surface 205 is a rear surface 206. In the first substrate 204, parts constituting the photoelectric conversion elements 303 and the transfer transistors 304 in FIG. 11 are arranged. The principal surface 205 of the first substrate 204 is overlaid with a multilayer interconnect structure 207 including a first interconnect layer 222 and a second interconnect layer 223, each of which includes an aluminum interconnect. The multilayer interconnect structure 207 further includes plugs made of tungsten in a manner similar to the first embodiment.

The second chip 202 includes a second substrate 208. In the second substrate 208, the surface on which the transistors are arranged is a principal surface 209 and the surface opposite the principal surface 209 is a rear surface 210. The principal surface 209 of the second substrate 208 is overlaid with a multilayer interconnect structure 211 including a first interconnect layer 228 and a second interconnect layer 229, each of which includes a copper interconnect. Unlike the first embodiment, the second interconnect layer is the copper interconnect in the present embodiment. The first interconnect layer 228 having a single-damascene structure and the second interconnect layer 229 having a dual-damascene structure are overlaid with antidiffusion films 231 and 232 for copper, respectively. The antidiffusion films 231 and 232 are made of, for example, silicon nitride or silicon carbide. The connection between, for example, each gate electrode and the first interconnect layer 228 is made using a plug made of, for example, tungsten. In the second substrate 208, parts constituting the amplifying transistors 306 in FIG. 11 are arranged.

In the solid-state image pickup device according to the present embodiment, the first chip 201 and the second chip 202 are laminated such that the principal surface 205 of the first substrate 204 and the rear surface 210 of the second substrate 208 face each other. Referring to FIG. 2, only the connection between the gate electrode 226 of each amplifying transistor in the second chip 202 and an FD region 213 in the first chip 201 is illustrated as the connection portion 311 between the first chip 201 and the second chip 202. Specifically, the FD region 213 in the first chip 201 is connected to the gate electrode 226 of each amplifying transistor through the multilayer interconnect structure 207, the connection portion 311, and the multilayer interconnect structure 211. A through electrode 235 constituting part of the connection portion 311 is disposed so as to extend through the second substrate 208. This through electrode connects the FD region 213 to the gate electrode 226 of the amplifying transistor. The connection portions 310, illustrated in FIG. 11, for supplying control signals to the gate electrodes, indicated at 214, of the transfer transistors are not illustrated in FIG. 2. The solid-state image pickup device according to the present embodiment is of the back side illumination type in which light is incident on the rear surface 206 of the first substrate 204.

The chips will be described in details. In the first substrate 204 of the first chip 201, wells 215, n-type charge storage regions 212 constituting the photoelectric conversion elements, and the gate electrodes 214 of the transfer transistors are arranged. In addition, the drain regions, indicated at 213, of the transfer transistors, element isolation regions 217, and p-type semiconductor regions 216 are arranged in the first substrate 204. The first chip 201 includes, adjacent to the rear surface 206 of the first substrate 204, an antireflection film 218, a light-shielding film 219, a color filter layer 220 including a planarizing layer or the like, and microlenses 221.

In the second substrate 208 of the second chip 202, wells 224 and element isolation regions 227 are arranged. In addition, source and drain regions 225 and the gate electrodes 226, serving as parts of the amplifying transistors 306 in FIG. 11, are arranged in the second substrate 208. In each of the gate electrodes 226 and the source and drain regions 225 of the transistors, a high-melting metal compound film 236 is disposed. The solid-state image pickup device includes the first interconnect layer 228 and the second interconnect layer 229 above the second substrate 208 and further includes an insulating layer 234 in the deepest portion of the second substrate 208. The solid-state image pickup device further includes a bonding layer 233 on the second chip 202 and a supporting substrate 230 on the bonding layer 233. The insulating layer 234, the bonding layer 233, and the supporting substrate 230 in the second embodiment will be described later.

The multilayer interconnect structure in the second chip 202 in the solid-state image pickup device according to the present embodiment includes the copper interconnects. The multilayer interconnect structure in the second substrate includes the copper interconnects, thus allowing finer interconnection. In addition, since only the second chip 202 has such copper interconnects, the incorporation of copper into the photoelectric conversion elements can be reduced. Thus, noise caused by the copper incorporation can be reduced.

Since the antidiffusion films 231 and 232 for copper are arranged, copper contained in the copper interconnects arranged in the second chip can be prevented from being incorporated into the photoelectric conversion elements and the semiconductor regions constituting the FD regions in the first chip. The second antidiffusion film 232 may have a flat upper surface. The reason is that the upper surface of the second antidiffusion film 232 serves as a surface joined to the bonding layer 233.

[Third Embodiment]

A solid-state image pickup device according to a third embodiment will be described with reference to FIG. 3. The solid-state image pickup device according to the present embodiment corresponds to the solid-state image pickup device 100 according to the first embodiment and differs therefrom in the form of the antidiffusion film. A configuration illustrated in FIG. 3 will be described below. Explanation of the same parts as those in the first embodiment is omitted.

Figure 3:
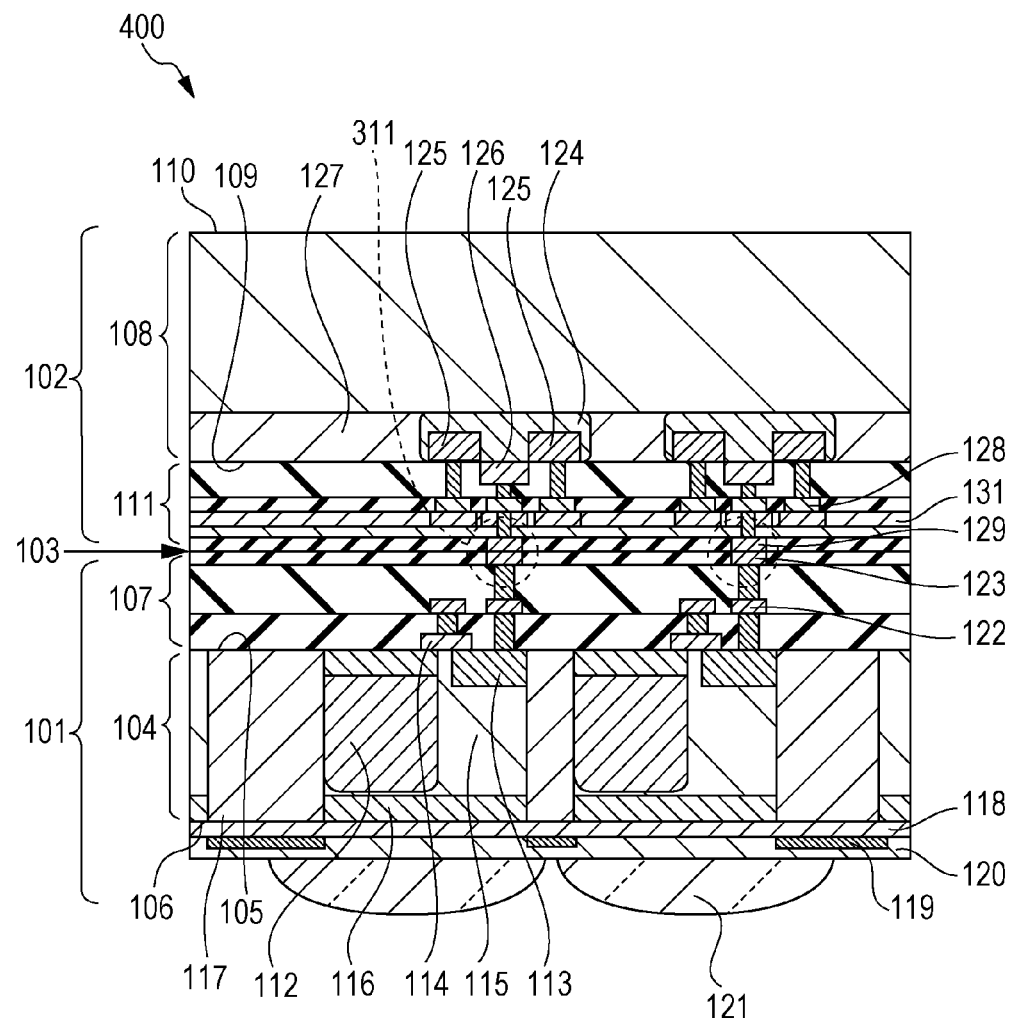
FIG. 3 is a cross-sectional view of a solid-state image pickup device according to a third embodiment of the present invention.

In the solid-state image pickup device, indicated at 400, in FIG. 3, the antidiffusion film 131 for copper covers a copper interconnect, serving as a first interconnect layer. The antidiffusion film 131 is patterned so as to correspond to the pattern of the interconnect. The material of the antidiffusion film 131 is the same as that in FIG. 1. As compared with the configuration in FIG. 1, the placement of the patterned antidiffusion film 131 in FIG. 3 can reduce the coupling capacity between interconnect segments and that between the interconnect layers. The reduction of the coupling capacitance can prevent crosstalk between the interconnect segments and signal delay in the interconnect.

Figure 5A:
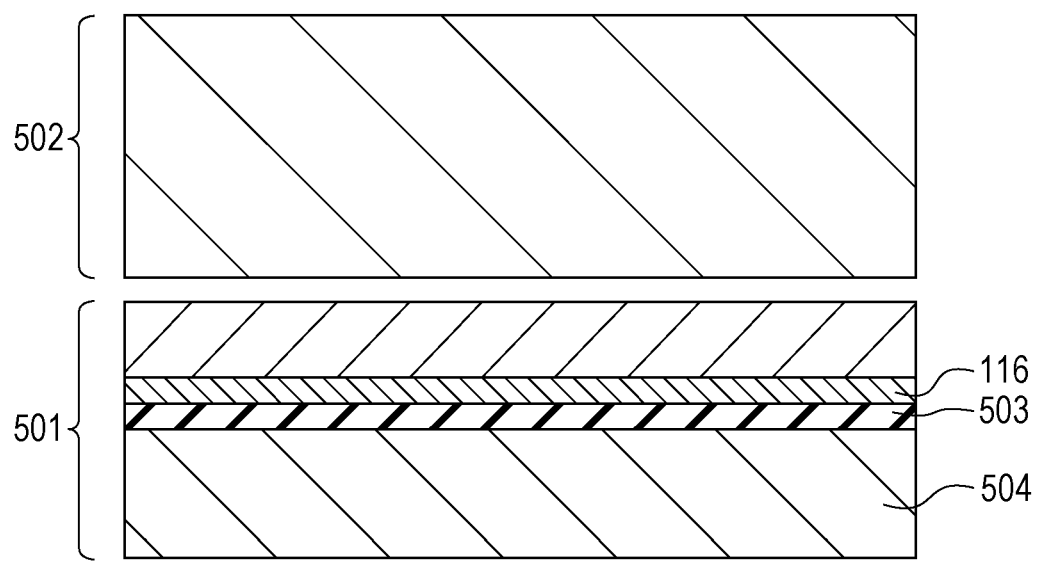
FIG. 5A illustrates a method of making the solid-state image pickup device according to the third embodiment.

A method of making the solid-state image pickup device 400 illustrated in FIG. 3 will be described below with reference to FIGS. 5A, 5B, 6A, and 6B. First, as illustrated in FIG. 5A, a photodiode forming member (hereinafter, "PD forming member") 501 to be the first substrate 104 and a circuit forming member 502 to be the second substrate 108 are prepared. The PD forming member 501 includes the p-type semiconductor region 116 and an insulating layer 503. The PD forming member 501 is formed of an SOI substrate. The p-type semiconductor region 116 may be formed by ion implantation or epitaxial growth.

Figure 5B:
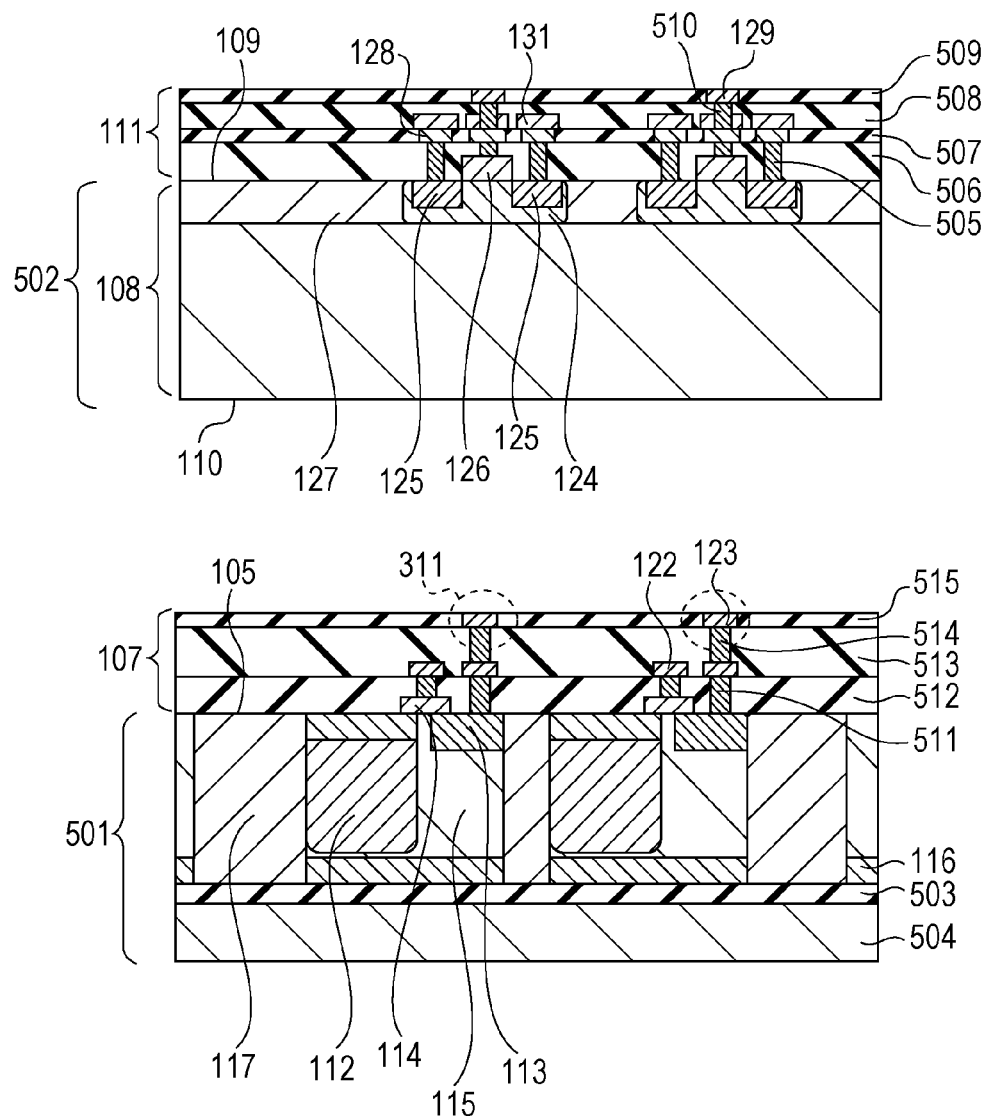
FIG. 5B illustrates the method of making the solid-state image pickup device according to the third embodiment.

Subsequently, as illustrated in FIG. 5B, the wells 115 and the elements, e.g., the charge storage regions 112 and the transfer gate electrodes 114, are formed in and on the PD forming member 501. The surface, on which the transfer gate electrodes are arranged, of the PD forming member 501 serves as the principal surface 105 of the first substrate 104. Then, the multilayer interconnect structure 107 is formed on the PD forming member 501. First, a first insulating interlayer 512 including a silicon oxide film is formed so as to cover the charge storage regions 212 and the transfer gate electrodes 214. After that, plugs 511 made of tungsten are formed in arbitrary positions in the first insulating interlayer 512. The plugs 511 are formed as follows. First, contact holes are formed in the first insulating interlayer 512. After that, a barrier metal film and a tungsten film are formed so that the contact holes are filled with the films. The barrier metal film and the tungsten film corresponding to an unnecessary portion are removed using a technique, such as etching or CMP, so that the plugs 511 are formed. After the formation of the plugs 511, an aluminum interconnect, serving as the first interconnect layer 122, is formed on the first insulating interlayer 512 and the plugs 511. The first interconnect layer 122 is formed in such a manner that a barrier metal film and an aluminum film are laminated and, after that, the laminate is patterned into a desired shape by, for example, etching. After the formation of the first interconnect layer 122, a second insulating interlayer 513 including a silicon oxide film is formed so as to cover the first insulating interlayer 512 and the first interconnect layer 122. Then, plugs 514 made of tungsten are formed in the second insulating interlayer 513. A method of making the plugs 514 is the same as that for the plugs 511. An aluminum interconnect, serving as the second interconnect layer 123, is formed in an arbitrary area by the same method as that for the first interconnect layer 122. Then, a third insulating interlayer 515 including a silicon oxide film is formed so as to cover the second interconnect layer 123. The third insulating interlayer 515 is planarized by etching or CMP. The third insulating interlayer 515 covering the second interconnect layer 123 is removed by the planarization process, so that the upper surface of the second interconnect layer 123 is exposed. The upper surface of the second interconnect layer 123 is flush with that of the third insulating interlayer 515. The multilayer interconnect structure 107 is formed in this manner.

In FIG. 5B, the wells 124 are formed in the circuit forming member 502 to form the circuits of, for example, the transistors including the amplifying transistors. The multilayer interconnect structure 111 is formed on the circuit forming member 502. First, a first insulating interlayer 506 including a silicon oxide film is formed so as to cover the source and drain regions 125 and the gate electrodes 126 of the transistors. After that, plugs 505 made of tungsten are formed in arbitrary positions in the first insulating interlayer 506. A method of forming the plugs 505 is the same as that for the plugs 511. Then, a second insulating interlayer 507 including a silicon oxide film is formed so as to cover the first insulating interlayer 506 and the plugs 505. The second insulating interlayer 507 may include a silicon nitride or organic insulating film or may be a laminate of those films and a silicon oxide film. A trench, serving as the first interconnect layer 128, is formed in an arbitrary area in the second insulating interlayer 507. Then, a barrier metal film and a copper film are laminated so that the trench is filled with the films. After that, the barrier metal film and the copper film corresponding to an unnecessary portion are removed by CMP, thus planarizing the laminated films. Then, for example, a silicon nitride film, serving as an antidiffusion film for copper, is formed so as to cover the second insulating interlayer 507 and the barrier metal and the copper in the trench. The silicon nitride film is patterned so that the bottom surface of the silicon nitride film covers the surface of the trench, namely, the entire surface of the copper interconnect pattern, so that the antidiffusion film 131 for copper is formed. Next, a third insulating interlayer 508 including, for example, a silicon oxide film is formed so as to cover the second insulating interlayer 507 and the antidiffusion film 131. Plugs 510, made of tungsten, for connection between the first interconnect layer and the second interconnect layer are formed in arbitrary positions in the third insulating interlayer 508. The second interconnect layer 129 including the aluminum interconnect is formed and a forth insulating interlayer 509 including a silicon oxide film is then formed so as to cover the second interconnect layer 129. After that, the forth insulating interlayer 509 is removed by etching or CMP so that the upper surface of the second interconnect layer 129 is exposed for the connection portions. The upper surface of the second interconnect layer 129 is flush with that of the forth insulating interlayer 509. The multilayer interconnect structure 111 is formed in the above-described manner.

Figure 6A:
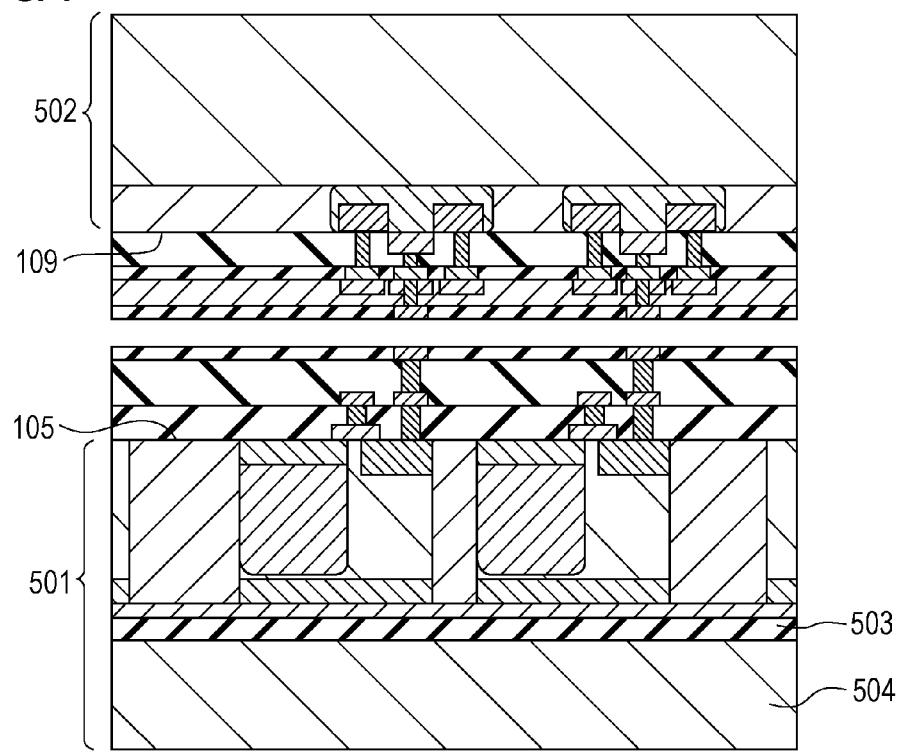
FIG. 6A illustrates the method of making the solid-state image pickup device according to the third embodiment.

Referring to FIG. 6A, the circuit forming member 502 is inverted and is placed so that the principal surface 109 of the second substrate faces the principal surface 105 of the first substrate. The members 501 and 502 are joined to each other through micro bumps.

Figure 6B:
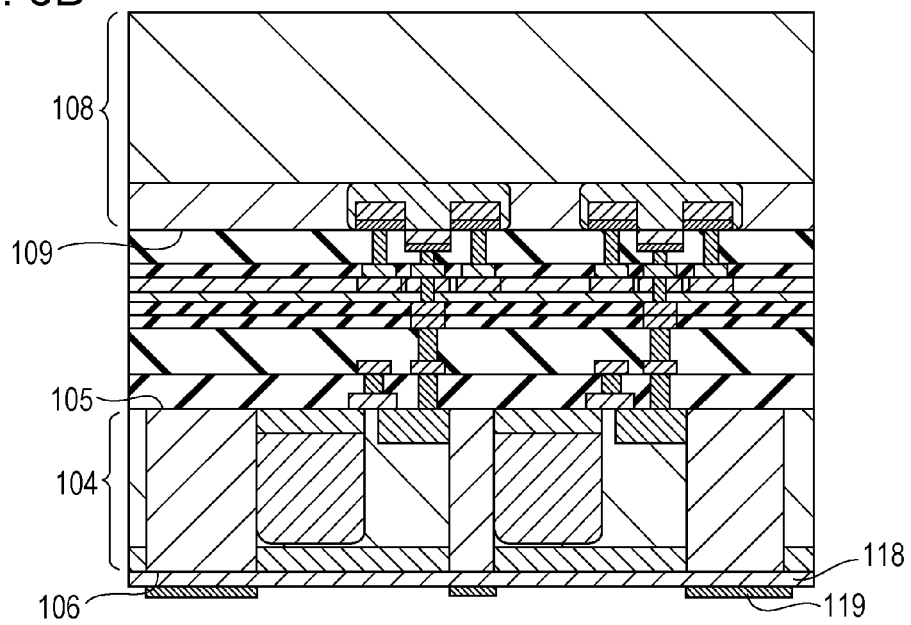
FIG. 6B illustrates the method of making the solid-state image pickup device according to the third embodiment.

Finally, as illustrated in FIG. 6B, an unnecessary portion 504 of the PD forming member 501 and the insulating layer 503 are removed by CMP or etching to thin the PD forming member 501, thus forming the first substrate 104. After that, the antireflection film 118 made of, for example, silicon nitride is formed adjacent to the rear surface 106 of the first substrate 104. After the formation of the antireflection film 118, a tungsten film is formed adjacent to the antireflection film. 118 and is then patterned, thus forming the light-shielding film 119. Subsequently, a planarizing layer and the color filter layer 120 are formed and the microlenses 121 are then formed. The solid-state image pickup device 400 illustrated in FIG. 3 can be made using the above-described method.

The solid-state image pickup device according to the present embodiment can increase the speed of a signal reading operation and reduce the coupling capacitance between interconnect segments as compared with the first embodiment.

[Fourth Embodiment]

A solid-state image pickup device according to a fourth embodiment will be described with reference to FIG. 4. The solid-state image pickup device according to the present embodiment has a configuration corresponding to that of the solid-state image pickup device 200 according to the second embodiment and differs therefrom in that the solid-state image pickup device according to the present embodiment includes patterned antidiffusion films. A configuration illustrated in FIG. 4 will be described below. Explanation of the same parts as those in the second embodiment is omitted.

Figure 4:
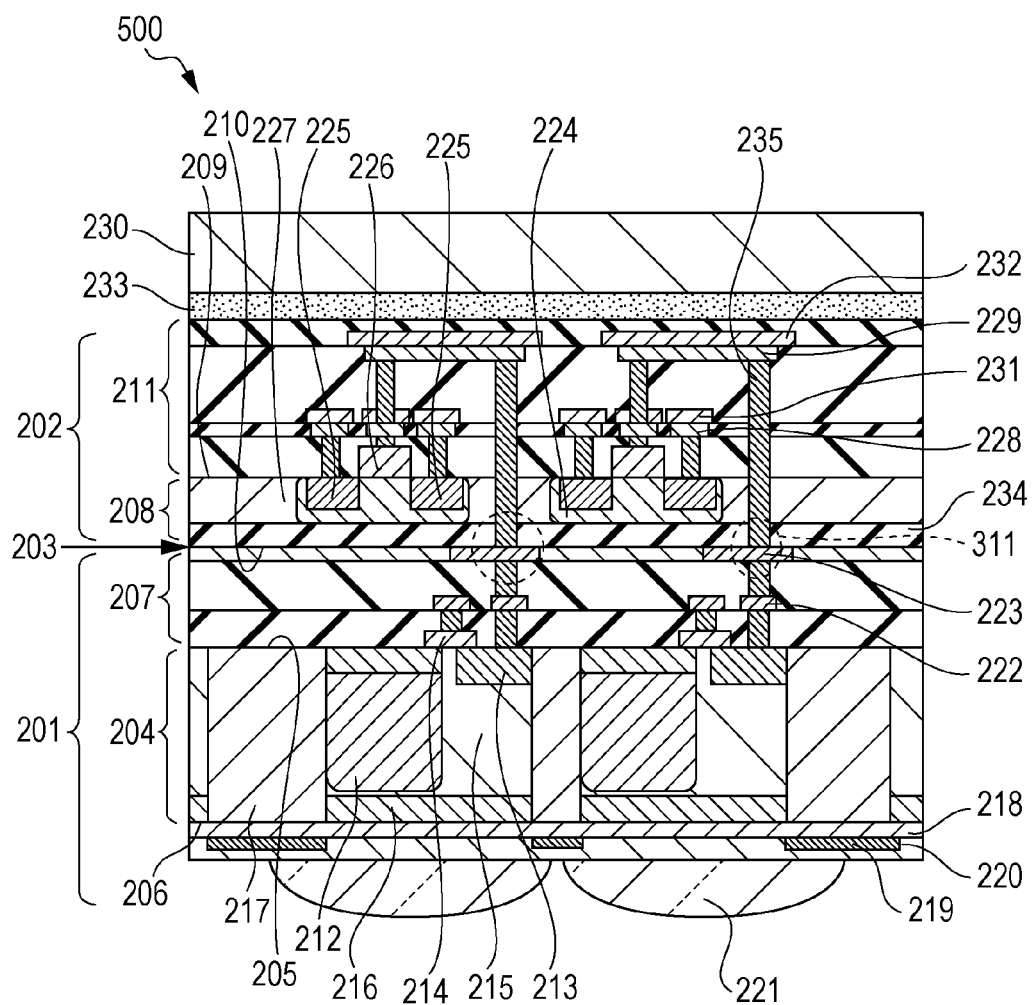
FIG. 4 is a cross-sectional view of a solid-state image pickup device according to a fourth embodiment of the present invention.

In the solid-state image pickup device, indicated at 500, in FIG. 4, the antidiffusion film 231 and the second antidiffusion film 232 for copper are patterned so as to correspond to the patterns of the interconnects, serving as the interconnect layers, in a manner similar to the third embodiment. The material of the antidiffusion films 231 and 232 is the same as that in FIG. 3. The arrangement of the patterned antidiffusion films 231 and 232 allows further reduction in the coupling capacitance between interconnect segments and that between the interconnect layers. The reduction of the coupling capacitance can prevent crosstalk between interconnect segments and signal delay in each interconnect.

Figure 7A:
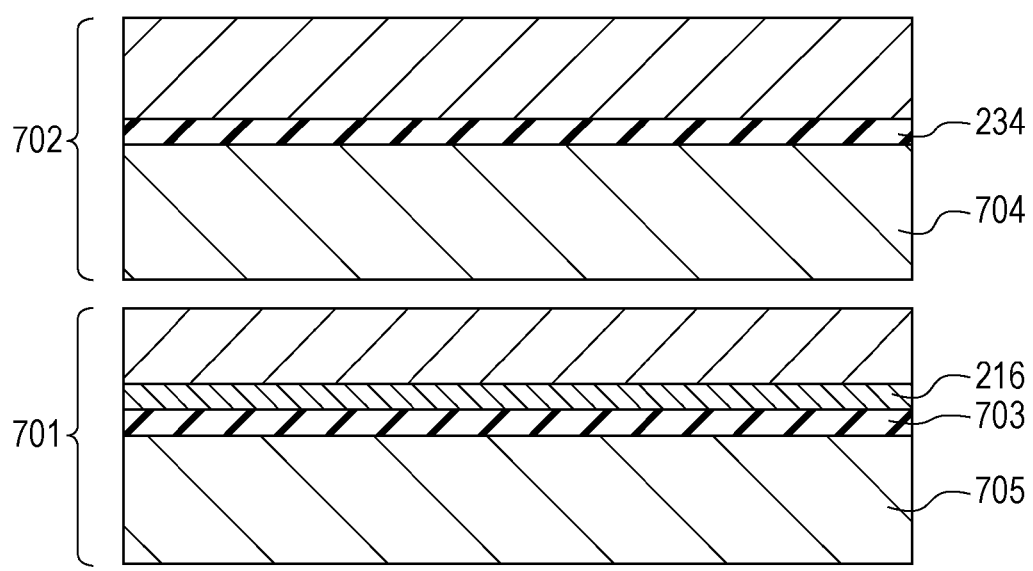
FIG. 7A illustrates a method of making the solid-state image pickup device according to the fourth embodiment.

A method of making the solid-state image pickup device 500 of FIG. 4 will be described with reference to FIGS. 7A to 9. Referring to FIG. 7A, first, a photodiode forming member (hereinafter, "PD forming member") 701 to be the first substrate 204 and a circuit forming member 702 to be the second substrate 208 are prepared. The PD forming member 701 includes the p-type semiconductor region 216 and an insulating layer 703. The PD forming member 701 is formed of an SOI substrate. The p-type semiconductor region 216 may be formed by ion implantation or epitaxial growth. The circuit forming member 702 includes the insulating layer 234. The circuit forming member 702 is formed of an SOI substrate.

Figure 7B:
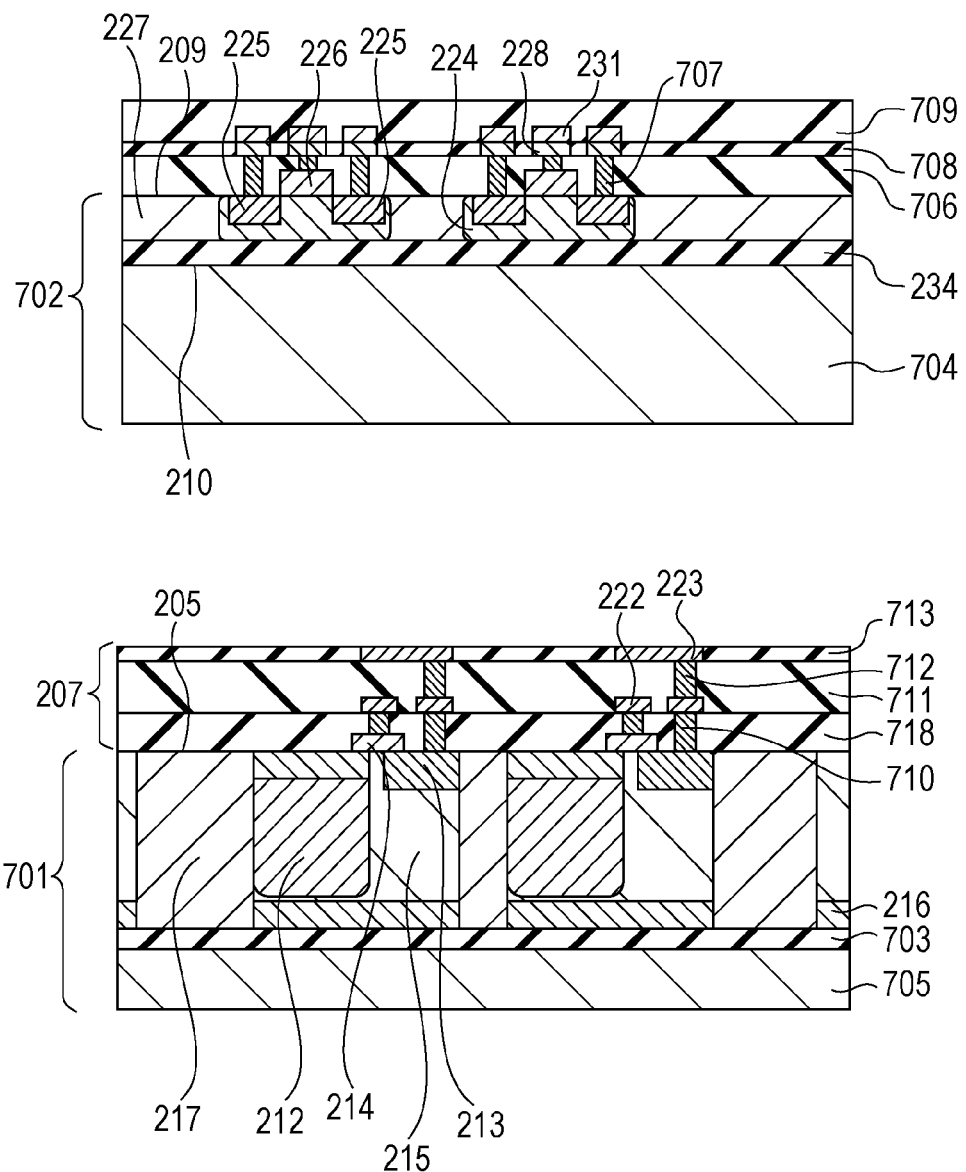
FIG. 7B illustrates the method of making the solid-state image pickup device according to the fourth embodiment.

Referring to FIG. 7B, the wells 215 and the elements, e.g., the charge storage regions 212 and the transfer gate electrodes 214, are formed in and on the PD forming member 701. The surface, on which the transfer gate electrodes are arranged, of the PD forming member 701 serves as the principal surface 205 of the first substrate 204. The multilayer interconnect structure 207 is formed on the PD forming member 701. The multilayer interconnect structure 207 includes the first and second interconnect layers 222 and 223, each of which includes the aluminum interconnect, a first insulating interlayer 718, plugs 710, a second insulating interlayer 711, plugs 712, and a third insulating interlayer 713. A method of making the multilayer interconnect structure is the same as that in the third embodiment.

In FIG. 7B, the wells 224 are formed in the circuit forming member 702 to form the circuits of, for example, the transistors including the amplifying transistors. The multilayer interconnect structure 211 is formed on the circuit forming member 702. In FIG. 7B, the multilayer interconnect structure 211 includes a first insulating interlayer 706, plugs 707, a second insulating interlayer 708, the first interconnect layer 228 including the copper interconnect, the first antidiffusion film 231, and a third insulating interlayer 709. Methods of making the layers and plugs are the same as those in the third embodiment. Accordingly, explanation of the methods is omitted.

Figure 8A:
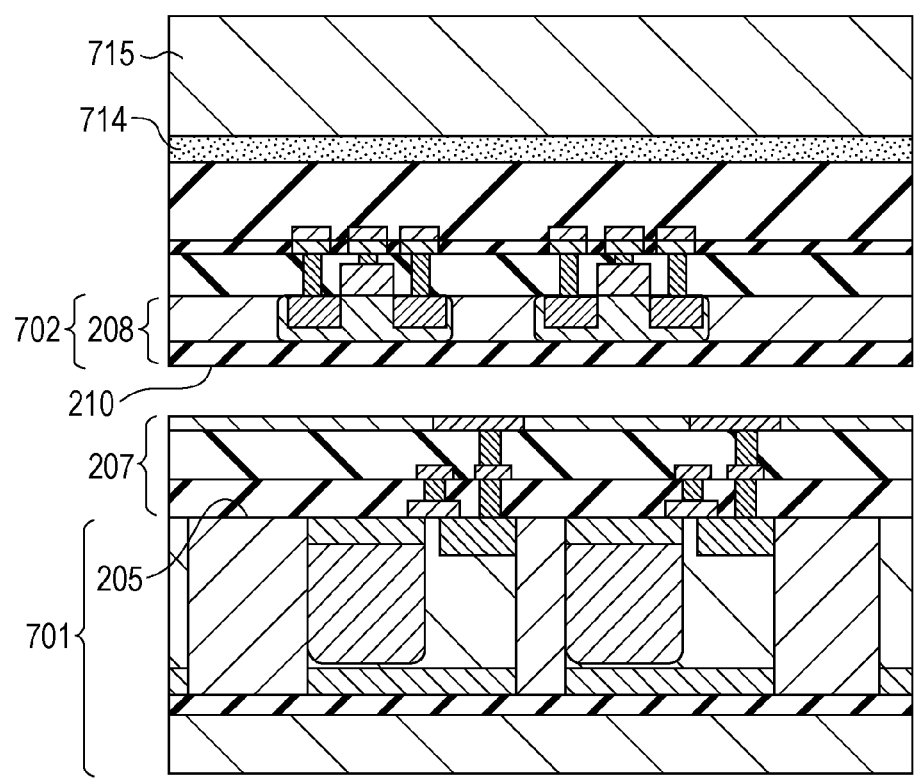
FIG. 8A illustrates the method of making the solid-state image pickup device according to the fourth embodiment.

Referring to FIG. 8A, a bonding layer 714 is provided on the third insulating interlayer 709 of the circuit forming member 702 and a supporting substrate 715 is provided on the bonding layer 714. An unnecessary portion 704 of the circuit forming member 702 is removed by etching or CMP, so that the rear surface 210 of the second substrate 208 is exposed. After that, the circuit forming member 702 is joined to the PD forming member 701 such that the rear surface 210 of the second substrate 208 faces the principal surface 205 of the first substrate 204. Then, the bonding layer 714 and the supporting substrate 715 are removed.

Figure 8B:
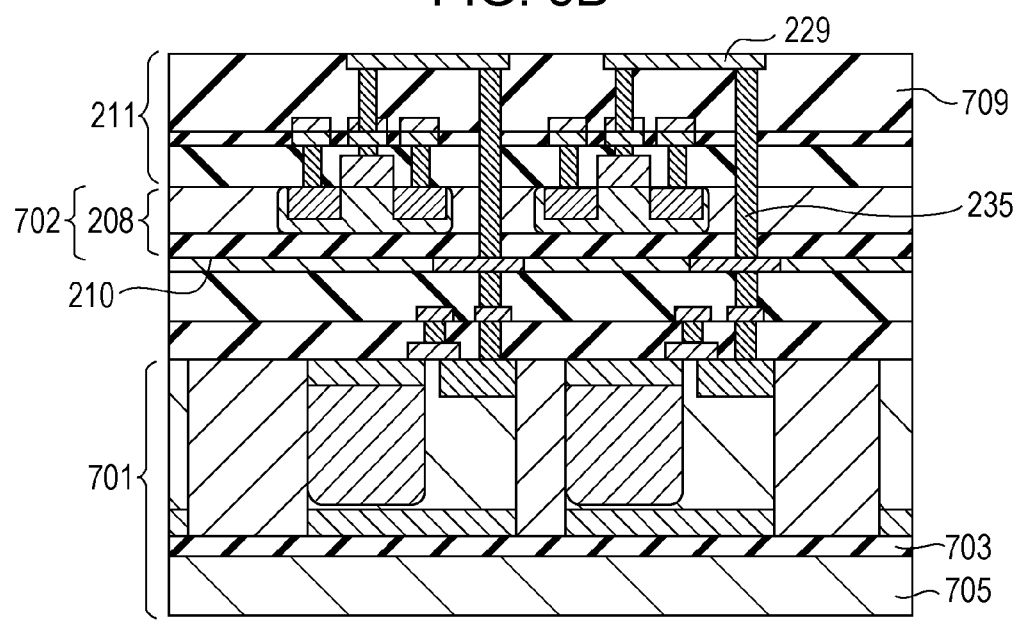
FIG. 8B illustrates the method of making the solid-state image pickup device according to the fourth embodiment.

Referring to FIG. 8B, the through electrodes 235 for conduction with the first substrate 204 are formed. Regarding a method of making the through electrodes 235, a general semiconductor process can be used. Plugs for connection between the first and second interconnect layers and a trench for the second interconnect layer 229 are formed in arbitrary positions in the third insulating interlayer 709. After the formation of the trench, the second interconnect layer 229 is formed by the same method as that for the first interconnect layer 228. The method of making the second interconnect layer 229 is a so-called single-damascene process. The plugs and the trench for the second interconnect layer 229 may be simultaneously formed to form the conductor. The method of making the plugs and the second interconnect layer 229 is a so-called dual-damascene process. After the formation of the second interconnect layer 229 including the copper interconnect, the second antidiffusion film 232 is formed. The second antidiffusion film 232 is formed in a manner similar to the first antidiffusion film 231. That is, a film made of, for example, silicon nitride is formed on the second interconnect layer 229 and is then patterned so as to cover the interconnect segments as the second interconnect layer 229, so that the second antidiffusion film 232 is formed. A fourth insulating interlayer 716 including, for example, a silicon oxide film is formed so as to cover the second antidiffusion film 232 and is then planarized. The fourth insulating interlayer 716 may include a silicon nitride film which also functions as a protective film.

Figure 9:
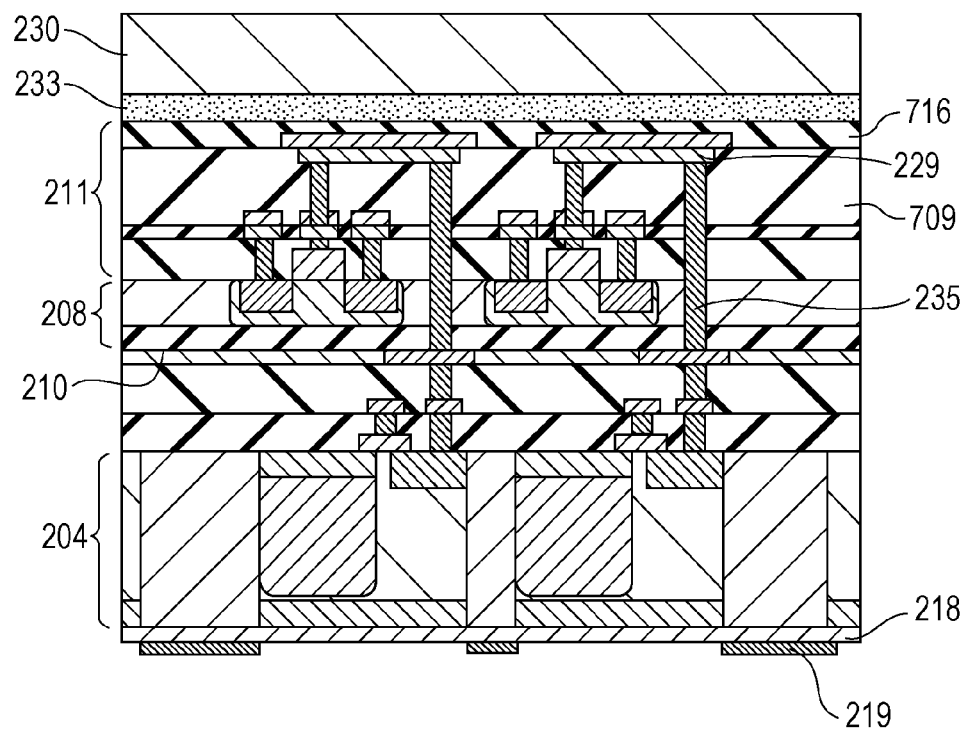
FIG. 9 illustrates the method of making the solid-state image pickup device according to the fourth embodiment.

Referring to FIG. 9, the bonding layer 233 is provided on the fourth insulating interlayer 716 and the supporting substrate 230 is provided on the bonding layer 233. An unnecessary portion 705 of the PD forming member 701 is removed by etching or CMP, so that the first substrate 204 is formed. After that, the antireflection film 218 made of, for example, silicon nitride is formed adjacent to the rear surface 206 of the first substrate 204. Then, the light-shielding film 219 made of, for example, tungsten is formed adjacent to the antireflection film 218. Subsequently, the planarizing layer and the color filter layer 220 are formed and the microlenses 221 are then formed. The solid-state image pickup device 500 illustrated in FIG. 4 is made by the above-described method.

The solid-state image pickup device according to the present embodiment can increase the speed of a signal reading operation and reduce the coupling capacitance between interconnect segments as compared with the second embodiment.

[Fifth Embodiment]

Solid-state image pickup devices according to a fifth embodiment will be described with reference to FIGS. 10A and 10B. The solid-state image pickup device, indicated at 600, illustrated in FIG. 10A has a configuration corresponding to that of the solid-state image pickup device 400 according to the third embodiment and the solid-state image pickup device, indicated at 700, illustrated in FIG. 10B has a configuration corresponding to that of the solid-state image pickup device 500 according to the fourth embodiment. A feature of the present embodiment is the placement of an antidiffusion film for copper in the first chip. Explanation of the same parts as those in the third embodiment and the fourth embodiment is omitted.

In the solid-state image pickup device 600 of FIG. 10A, a third antidiffusion film 801 is included in the multilayer interconnect structure 107 of the first chip 101 in the solid-state image pickup device 400. Specifically, the upper surface of the third antidiffusion film 801 is flush with that of the second interconnect layer 123 to cover the entire surface of the first substrate 104. The placement of the third antidiffusion film 801 can further reduce the diffusion of copper from the second chip 102. In FIG. 10A, each of the first interconnect layer 128 and the second interconnect layer 129 includes a copper interconnect. Specifically, the second interconnect layer 129 has a dual-damascene structure including the second interconnect layer 129 and plugs for connection between the first interconnect layer 128 and the second interconnect layer 129 such that the plugs and the second interconnect layer 129 are continuously formed from the same conductor. This configuration can also prevent the diffusion of copper contained in the second interconnect layer 129 exposed in the connection portions 311.

If the third antidiffusion film 801 is in any position in the multilayer interconnect structure 107, the same advantages are obtained so long as the third antidiffusion film 801 is included in the multilayer interconnect structure 107. If the third antidiffusion film 801 does not cover the entire surface of the first substrate 104, the effect of preventing the diffusion of copper is obtained. The third antidiffusion film 801 may cover the entire surface of the first substrate 104. When the high-melting metal compound film 136 is placed on the second substrate 108, the third antidiffusion film 801 can also function as an antidiffusion film for high-melting metal.

In the solid-state image pickup device 700 of FIG. 10B, a third antidiffusion film 901 is included in the multilayer interconnect structure 207 of the first chip 201 in the solid-state image pickup device 500. Specifically, the third antidiffusion film 901 is placed so as to cover the second interconnect layer 223. With this configuration, even if copper diffuses in the second substrate 208, the diffusion of copper into, for example, the photoelectric conversion elements in the first substrate 204 can be prevented.

The third antidiffusion film 901 may be placed in any position in the multilayer interconnect structure 207. The third antidiffusion film. 901 may be placed on the second interconnect layer 223 because the coupling capacitance between the interconnect layers can be reduced. In a case where the high-melting metal compound film 136 is placed on the second substrate 208, if high-melting metal diffuses in the second substrate 208, the third antidiffusion film 901 can prevent the diffusion of high-melting metal into, for example, the photoelectric conversion elements in the first substrate 204.

[Sixth Embodiment]

Figure 12:
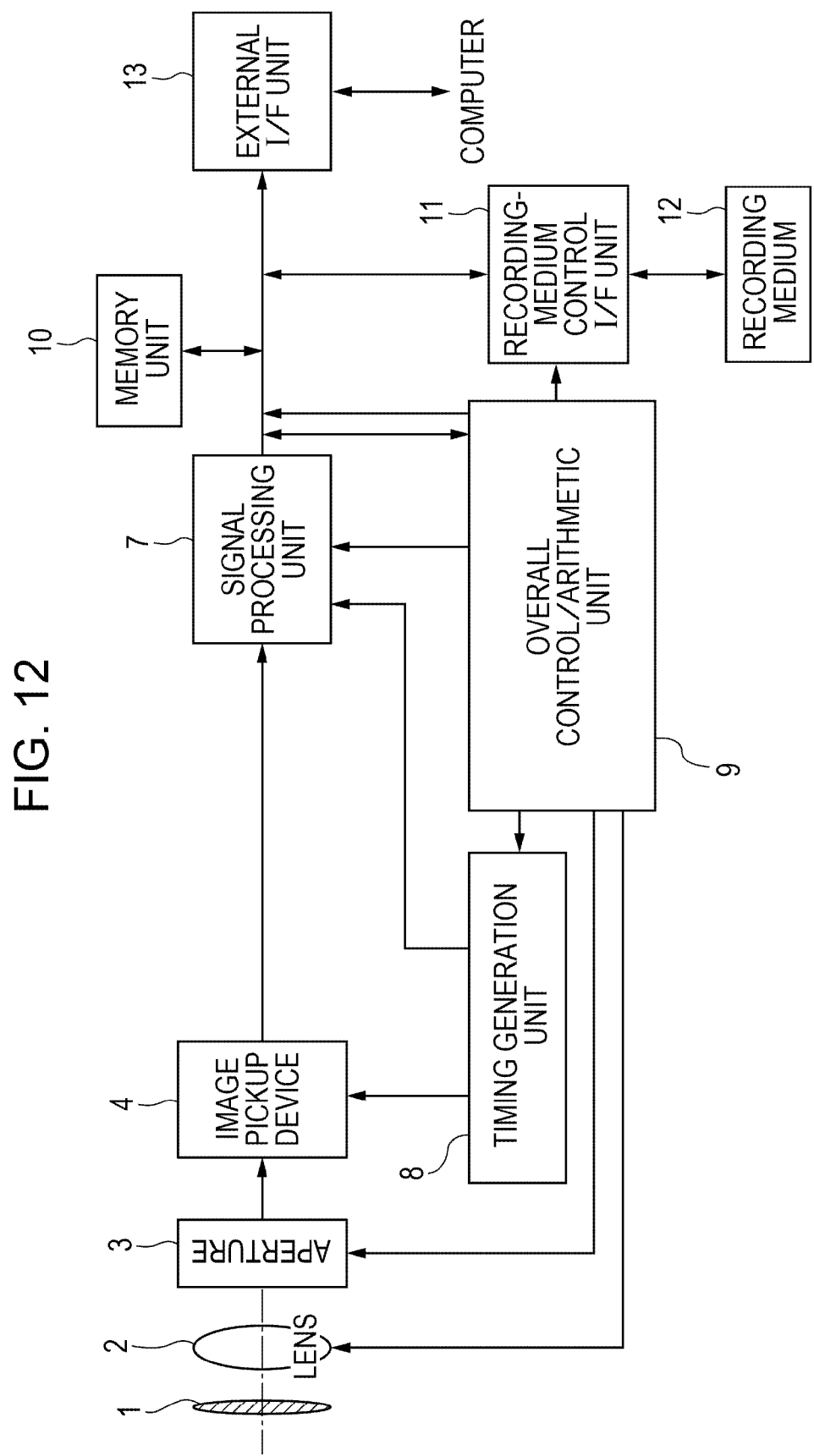
FIG. 12 is a block diagram illustrating an image pickup system according to a sixth embodiment of the present invention.

A sixth embodiment will be described with respect to a case where the solid-state image pickup device according to the present embodiment is applied as an image pickup device to an image pickup system. The image pickup system includes, for example, a digital still camera or a digital camcorder. FIG. 12 is a block diagram of the application of the solid-state image pickup device to a digital still camera as an example of the image pickup system.

Referring to FIG. 12, a barrier 1 is configured to protect a lens. The lens, indicated at 2, forms an optical image of a subject on an image pickup device 4. An aperture 3 is configured to vary the quantity of light passing through the lens 2. The image pickup device 4 corresponds to any of the solid-state image pickup devices described in the foregoing embodiments. The image pickup device 4 converts the optical image formed through the lens 2 into image data. The image pickup device 4 includes an A/D converter. Specifically, the A/D converter is placed in the second chip. A signal processing unit 7 performs various correction processes on image data output from the image pickup device 4 and compresses the data. In FIG. 12, reference numeral 8 denotes a timing generation unit that outputs various timing signals to the image pickup device 4 and the signal processing unit 7; 9 an overall control and arithmetic unit (hereinafter, "overall control/arithmetic unit") that performs various arithmetic operations and controls the whole of the digital still camera; 10 a memory unit configured to temporarily store image data; 11 an interface (I/F) unit through which data is recorded into or read from a recording medium; 12 a removable recording medium, such as a semiconductor memory, which image data is recorded into or read from; and 13 an interface (I/F) unit to communicate with, for example, an external computer. A timing signal may be externally supplied to the image pickup system. The image pickup system may include at least the image pickup device 4 and the signal processing unit 7 for processing image data output from the image pickup device. The present embodiment has been described with respect to the case where the image pickup device 4 includes the A/D converter. The image pickup device and the A/D converter may be provided for different chips. The image pickup device 4 may include, for example, the signal processing unit 7.

As described above, the solid-state image pickup device according to the present invention can be applied to the image pickup system. The application of the solid-state image pickup device according to the present invention to the image pickup system allows obtaining of high quality images.

As described above, the solid-state image pickup device according to the present invention can achieve higher pattern designing and reduce dark current in the photoelectric conversion elements. The embodiments are not restricted to the described configurations. The embodiments can be appropriately combined.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A solid-state image pickup device comprising:
   a first substrate having a first transistor and a photoelectric conversion element;
   a second substrate having a second transistor, the first and second substrates being laminated;
   a first interconnect electrically connected to the second transistor, the first interconnect being mainly made of copper;
   a second interconnect electrically connected to the first interconnect, the second interconnect being mainly made of copper;
   a third interconnect electrically connected to the second interconnect and disposed between the first substrate and the second substrate, the third interconnect being mainly made of aluminum; and
   a plug arranged in a hole of an insulating interlayer between the first substrate and the second substrate, the plug being made of tungsten,
   wherein
      a distance between the second interconnect and the second substrate is greater than a distance between the first interconnect and the second substrate,
      a distance between the second interconnect and the first substrate is greater than a distance between the third interconnect and the first substrate,
      the distance between the third interconnect and the first substrate is greater than a distance between a gate electrode of the first transistor and the first substrate, and
      the distance between the third interconnect and the first substrate is greater than a distance between the plug and the first substrate.

2. The device according to claim 1, wherein the first substrate and second substrate are laminated such that the first interconnect and the second interconnect are disposed between the first substrate and the second substrate.

3. The device according to claim 1, wherein the third interconnect is electrically connected to the first transistor.

4. The device according to claim 1, wherein the first interconnect is electrically connected to the second transistor through another plug disposed between the second substrate and the first interconnect, the another plug being made of tungsten.

5. The device according to claim 1, wherein the second transistor includes a metal compound disposed in contact with an insulating interlayer.

6. The device according to claim 1, wherein the insulating interlayer is disposed between the third interconnect and the first substrate.

7. The device according to claim 1, wherein a fourth interconnect electrically connected to the first transistor through the plug is disposed between the first substrate and the second substrate, and the distance between the third interconnect and the first substrate is greater than a distance between the fourth interconnect and the first substrate.

8. The device according to claim 1, wherein an antidiffusion film for copper is disposed between the first interconnect and the second interconnect.

9. The device according to claim 8, wherein the antidiffusion film for copper is patterned so as to correspond to a pattern of the first interconnect.

10. The device according to claim 4, wherein the second transistor includes a metal compound connected to the another plug.

11. The device according to claim 1, wherein the first transistor is a transfer transistor to transfer charge from the photoelectric conversion element to a floating diffusion.

12. The device according to claim 1, wherein the first substrate has an amplifying transistor including a gate electrode to which a signal based on a charge generated in the photoelectric conversion element, is input.

13. An image pickup system comprising:
a solid-state image pickup device; and
a signal processing unit configured to process a signal output from the solid-state image pickup device, wherein
the solid-state image pickup device comprises:
a first substrate having a first transistor and a photoelectric conversion element;
a second substrate having a second transistor, the first and second substrates being laminated;
a first interconnect electrically connected to the first transistor, the first interconnect being mainly made of copper;
a second interconnect electrically connected to the first interconnect, the second interconnect being mainly made of copper;
a third interconnect electrically connected to the second interconnect and disposed between the first substrate and the second substrate, the third interconnect being mainly made of aluminum; and
a plug arranged in a hole of an insulating interlayer between the first substrate and the second substrate, the plug being made of tungsten,
wherein
a distance between the second interconnect and the second substrate is greater than a distance between the first interconnect and the second substrate,
a distance between the second interconnect and the first substrate is greater than a distance between the third interconnect and the first substrate,
the distance between the third interconnect and the first substrate is greater than a distance between a gate electrode of the first transistor and the first substrate, and
the distance between the third interconnect and the first substrate is greater than a distance between the plug and the first substrate.

14. The device according to claim 7, wherein the fourth interconnect is electrically connected to the first transistor through a plug disposed between the first substrate and the fourth interconnect, the plug being made of tungsten.

15. The device according to claim 7, wherein an interconnect included in an interconnect layer including the fourth interconnect, is electrically connected to the gate electrode of the first transistor.

16. A solid-state image pickup device comprising:
a first substrate having a photoelectric conversion element and a first transistor;
a second substrate having a second transistor, the first and second substrates being laminated;
a first interconnect electrically connected to the second transistor;
a second interconnect electrically connected to the first interconnect, the second interconnect being mainly made of copper;
a third interconnect electrically connected to the second interconnect, the third interconnect being mainly made of aluminum; and
a fourth interconnect electrically connected to the third interconnect,
wherein
a distance between the second interconnect and the second substrate is greater than a distance between the first interconnect and the second substrate,
a distance between the second interconnect and the first substrate is greater than a distance between the third interconnect and the first substrate,
the distance between the third interconnect and the first substrate is greater than a distance between the fourth interconnect and the first substrate, and
the distance between the fourth interconnect and the first substrate is greater than a distance between a gate electrode of the first transistor and the first substrate.

17. The device according to claim 16, wherein the first interconnect, the second interconnect, the third interconnect and the fourth interconnect are disposed between the first substrate and the second substrate.

18. The device according to claim 16, wherein the first substrate and the fourth interconnect are electrically connected each other through a plug disposed between the fourth interconnect and the first substrate, the plug being made of tungsten.

19. The device according to claim 16, wherein the second substrate and the first interconnect are electrically connected each other through a plug disposed between the second substrate and the first interconnect, the plug being made of tungsten.

* * * * *